United States Patent
Lee et al.

(10) Patent No.: US 7,352,022 B2
(45) Date of Patent: Apr. 1, 2008

(54) CAPACITOR HAVING A DIELECTRIC LAYER THAT REDUCES LEAKAGE CURRENT AND A METHOD OF MANUFACTURING THE SAME

(75) Inventors: Jung-hyun Lee, Yongin-si (KR); Sung-ho Park, Seongnam-si (KR); Bum-seok Seo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 122 days.

(21) Appl. No.: 11/207,740

(22) Filed: Aug. 22, 2005

(65) Prior Publication Data

US 2006/0040445 A1 Feb. 23, 2006

(30) Foreign Application Priority Data

Aug. 20, 2004 (KR) .................. 10-2004-0065877

(51) Int. Cl.
*H01L 27/108* (2006.01)
(52) U.S. Cl. .................. 257/296; 257/303; 257/306
(58) Field of Classification Search ................ 257/296, 257/303, 306, 310, E27.048
See application file for complete search history.

(56) References Cited

U.S. PATENT DOCUMENTS

| | | | | |
|---|---|---|---|---|
| 6,078,072 A | * | 6/2000 | Okudaira et al. | ........... 257/295 |
| 2004/0235285 A1 | * | 11/2004 | Kang et al. | .................. 438/597 |
| 2004/0259305 A1 | * | 12/2004 | Demaray et al. | ........... 438/240 |
| 2005/0082593 A1 | * | 4/2005 | Lee et al. | .................... 257/306 |
| 2005/0130326 A1 | * | 6/2005 | Lee et al. | ....................... 438/3 |
| 2005/0139965 A1 | * | 6/2005 | Lee | ............................. 257/632 |
| 2005/0141168 A1 | * | 6/2005 | Lee et al. | ................ 361/306.3 |
| 2005/0151184 A1 | * | 7/2005 | Lee et al. | ................... 257/314 |
| 2005/0248906 A1 | * | 11/2005 | Yeo et al. | ................ 361/306.2 |
| 2006/0022250 A1 | * | 2/2006 | Inomata | ...................... 257/306 |
| 2006/0054980 A1 | * | 3/2006 | Kim et al. | .................. 257/410 |
| 2006/0252244 A1 | * | 11/2006 | Vaartstra et al. | ............ 438/608 |

* cited by examiner

*Primary Examiner*—Thao P. Le
(74) *Attorney, Agent, or Firm*—Lee & Morse, P.C.

(57) ABSTRACT

A capacitor having a dielectric layer including a composite oxide, the composite oxide including a transition metal and including a lanthanide group element, a memory device including the same and a method of manufacturing the capacitor are provided. The transition metal may be titanium and the composite oxide may be nitrided. The method may include providing a precursor of a transition metal, providing a precursor of a lanthanide group element, and forming a composite oxide on the lower electrode by oxidizing both the precursor of the transition metal and the precursor of the lanthanide group element, the composite oxide containing the transition metal and the lanthanide group element.

30 Claims, 5 Drawing Sheets

CAPACITOR HAVING A DIELECTRIC LAYER THAT REDUCES LEAKAGE CURRENT AND A METHOD OF MANUFACTURING THE SAME

BACKGROUND OF THE INVENTION

1. Field of the Invention

The present invention relates to a capacitor having a dielectric layer and a method of manufacturing the same. More particularly, the present invention relates to a capacitor having a dielectric layer that includes a composite oxide, the composite oxide including a transition metal and including a lanthanide group element, which may reduce leakage current, and a method of manufacturing the same.

2. Description of the Related Art

As technology has developed, lightweight and miniature electronic devices with high performance have drawn increasing attention. To make electronic devices, e.g., mobile phones, MP3 players, digital cameras, PDAs, etc. smaller, continuing miniaturization, e.g., by increasing the level of integration, is required. One aspect of this ongoing miniaturization is the continuing development and increased integration of embedded memory devices. A ferroelectric random access memory (FRAM), which typically uses a dielectric material for an information storage layer, is a non-volatile memory device with applications in mobile devices. To realize a high level of integration of the dielectric memory device, it is important to increase the total capacity of ferroelectric capacitor per unit area. Many memory devices, e.g., dynamic random access memory (DRAM), rely on capacitors to store information. For a given dielectric material, the capacitance of a capacitor may be increased by increasing the area of the capacitor, as shown in Equation 1:

$$C = \varepsilon \frac{A}{t}. \quad \text{[Equation 1]}$$

In Equation 1, $\varepsilon$ is capacitance, c is a dielectric constant, A is an effective area, and t is the thickness of a dielectric layer.

As set forth in Equation 1, when the thickness of a dielectric layer is reduced and the effective area of a capacitor is increased, the capacitance of the capacitor increases. This poses a dilemma as the integration of semiconductor memory devices continues to increase and memory devices must become more dense. In particular, increasing the area of the capacitor may limit the increase in the integration density of a semiconductor device if the capacitor has a planar structure.

Another aspect of increasing the density of memory devices is that the required charge storage capacity of a capacitor (and therefore of the dielectric) per unit area needs to increase, since the required charge needs to be stored in a smaller capacitor. To increase the charge storage capacity of a dielectric, it is desirable to reduce the thickness of the dielectric layer and/or use a material having a high dielectric constant for the dielectric layer. However, when the thickness of the dielectric layer is reduced, the dielectric may increasingly lose its stored charge due to a significant increase in tunneling current. That is, there is a limitation in reducing the thickness of a dielectric layer, since the possibility of generating a leakage current increases when the thickness of the dielectric layer is excessively reduced.

Accordingly, much effort has been directed to developing a material having a higher dielectric constant and better leakage current characteristics than a conventional dielectric. However, there are many difficulties associated with the development of such a new material.

FIG. 1 illustrates a cross-sectional view of a conventional capacitor having a dielectric layer. Referring to FIG. 1, a lower electrode 12, a dielectric layer 13, and an upper electrode 14 are sequentially formed on a lower structure 11. The dielectric layer 13 is generally formed of a dielectric material having a high dielectric constant. However, when a transition metal oxide, such as $TiO_2$, is used for the dielectric layer 13, a larger leakage current is produced by the capacitor than when other materials are used for the dielectric layer 13.

FIG. 2A illustrates a graph of leakage current density versus physical thicknesses (in Å) of dielectric layers formed of different materials, measured over a range of operating voltages. Referring to FIG. 2A, all of the four materials have high leakage currents in a range of thickness from 40 to 60 Å, which constitutes a very thin dielectric. Further, $TiO_2$ leads to a relatively greater leakage current than other materials.

FIG. 2B illustrates a graph of $O_2$ concentration profile with respect to Ti oxides according to depths of the Ti oxides, as determined by X-ray photoelectron spectroscopy (XPS). Ruthenium (Ru) is used for upper and lower electrodes 12 and 14 in FIG. 1, and $TiO_2$ is used for the dielectric layer 13. The results illustrated in FIG. 2B indicate that Ti exists in two oxide forms ($3^+$ and $4^+$). Referring to FIG. 2B, $TiO_2$ peaks are observed at different depths. In addition, as indicated by an arrow, the oxidation state of Ti changes and two oxide forms are apparent. Typically, when a transition metal oxide having a variety of oxidation states is used for a dielectric layer 13, it may be difficult to reduce leakage current.

SUMMARY OF THE INVENTION

The present invention is therefore directed to a capacitor having a dielectric layer including a composite oxide, a memory device including the same and a method of manufacturing the capacitor, which substantially overcome one or more of the problems due to the limitations and disadvantages of the related art.

It is therefore a feature of an embodiment of the present invention to provide a capacitor having a dielectric layer including a composite oxide, the composite oxide including a transition metal and including a lanthanide group element. The dielectric layer may reduce leakage current even though it contains a transition metal oxide.

It is therefore another feature of an embodiment of the present invention to provide a memory device including the capacitor and a method of manufacturing the capacitor.

At least one of the above and other features and advantages of the present invention may be realized by providing a capacitor including a lower electrode on a semiconductor substrate, a dielectric layer on the lower electrode, and an upper electrode on the dielectric layer, wherein the dielectric layer may include a composite oxide, the composite oxide including a transition metal and including a lanthanide group element.

The composite oxide may include a transition metal (T) and a lanthanide group element (L) in an atomic ratio ranging from about 70T:30L to about 40T:60L. The lanthanide group element may include lanthanum, cerium, praseodymium, neodymium, promethium, samarium, europium, gadolinium, terbium, dysprosium, holmium, erbium, thulium, ytterbium, and/or lutetium and the transition metal may include Ti.

The dielectric layer may be a nitride of the composite oxide and may include LnTiON, where Ln is lanthanum, cerium, praseodymium, neodymium, promethium, samarium, europium, gadolinium, terbium, dysprosium, holmium, erbium, thulium, ytterbium, and/or lutetium. The lower electrode and the upper electrode may include ruthenium.

At least one of the above and other features and advantages of the present invention may also be realized by providing a semiconductor memory device including a semiconductor substrate having first and second dopant regions, a gate structure formed between the first and second dopant regions, and a capacitor electrically connected to the second dopant region, the capacitor including a lower electrode, a dielectric layer on the lower electrode, and an upper electrode on the dielectric layer, wherein the dielectric layer may include a composite oxide, the composite oxide including a transition metal and including a lanthanide group element.

The transition metal (T) and the lanthanide group element (L) in the composite oxide may be present in an atomic ratio ranging from about 70T:30L to about 40T:60L. The lanthanide group element may include lanthanum, cerium, praseodymium, neodymium, promethium, samarium, europium, gadolinium, terbium, dysprosium, holmium, erbium, thulium, ytterbium, and/or lutetium and the transition metal may include Ti. Also, the dielectric layer may include a nitride of the composite oxide of a transition metal and a lanthanide group element. The dielectric layer may include providing a precursor of a transition metal.

At least one of the above and other features and advantages of the present invention may further be realized by providing a method of manufacturing a capacitor, including forming a lower electrode, forming a dielectric layer on the lower electrode, and forming an upper electrode on the dielectric layer, wherein forming the dielectric layer may include forming a composite oxide including a transition metal and including a lanthanide group material on the lower electrode.

Forming the composite oxide may include inputting a precursor of the transition metal and a precursor of the lanthanide group material into a reaction chamber, forming a precursor composite layer of the precursor of the transition metal and the precursor of the lanthanide group material on the lower electrode, and oxidizing the precursor composite layer formed of the precursor of the transition metal and the precursor of the lanthanide group material.

Oxidizing the precursor composite layer may include discharging the precursor of the transition metal and the precursor of the lanthanide group material, which remain unreacted in the reaction chamber, to the outside of the reaction chamber, and oxidizing the precursor composite layer of the precursor of the transition metal and the precursor of the lanthanide group material by injecting a material containing oxygen into the reaction chamber.

The transition metal (T) and the lanthanide group element (L) in the composite oxide may be present in an atomic ratio ranging from about 70T:30L to about 40T:60L and the precursor of the lanthanide group element may include $Ln(TMHD)_3$ and $Ln(i-PrCp)_3$, where Ln is lanthanum, cerium, praseodymium, neodymium, promethium, samarium, europium, gadolinium, terbium, dysprosium, holmium, erbium, thulium, ytterbium, and/or lutetium. The precursor of the transition metal may include $Ti(i-OPr)_2(TMHD)_2$, $Ti(i-OPr)_4$, and/or $Ti(DMPD)(TMHD)_2$.

The precursor of the transition metal and the precursor of the lanthanide group element may be provided into a reaction chamber at the same time and the precursor of the transition metal and the precursor of the lanthanide group element may be oxidized together. The precursor of the transition metal and the precursor of the lanthanide group element may be provided into a reaction chamber sequentially and the precursor of the transition metal and the precursor of the lanthanide group element may be oxidized together.

The method may also include nitriding the oxidized precursor composite layer. The nitrided oxidized precursor composite layer may include LnTiON, where Ln is lanthanum, cerium, praseodymium, neodymium, promethium, samarium, europium, gadolinium, terbium, dysprosium, holmium, erbium, thulium, ytterbium, and/or lutetium. The lower electrode and the upper electrode may both include ruthenium.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
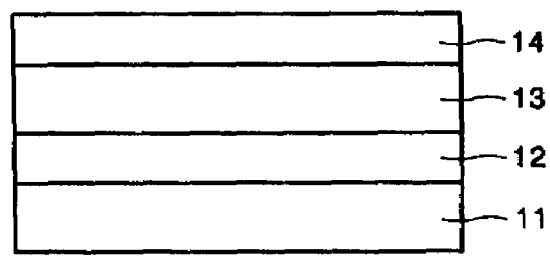
FIG. 1 illustrates a cross-sectional view of a conventional capacitor having a dielectric layer.

Korean Patent Application No. 10-2004-0065877, filed on Aug. 20, 2004, in the Korean Intellectual Property Office, and entitled: "Capacitor Having Dielectric Layer That Reduces Leakage Current and Method of Manufacturing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 3:
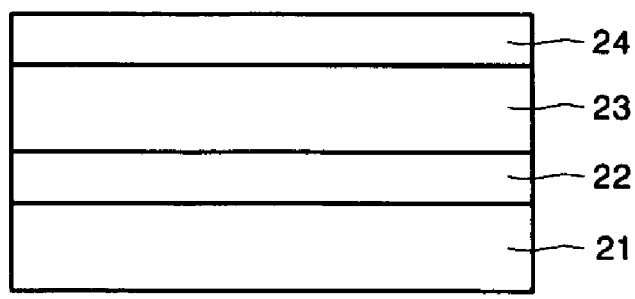
FIG. 3 illustrates a cross-sectional view of a capacitor that includes a dielectric layer according to an embodiment of the present invention.

FIG. 3 illustrates a cross-sectional view of a capacitor that includes a dielectric layer according to an embodiment of the present invention. Referring to FIG. 3, an aspect of the present invention is that, in a capacitor that includes a lower structure 21, a lower electrode 22, a dielectric layer 23, and an upper electrode 24, the dielectric layer 23 may be formed by mixing a transition metal oxide with an oxide of a lanthanide group element. The transition metal oxides may include suitable oxides of, e.g., scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), ununnilium (Uun), unununium (Uuu), and/or ununbium (Uub). The lanthanide group element may include, e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and/or lutetium (Lu). The formation of the lower electrode 22 on the lower structure 21 and the formation of the upper electrode 24 on the dielectric layer 23 may be performed by semiconductor processes generally known in the art.

The dielectric layer 23 may be formed selectively using, e.g., chemical vapor deposition (CVD) or atomic layer deposition (ALD). An example of forming the dielectric layer 23 using a transition metal and an oxide of a lanthanide group element by a CVD process will be described in detail.

The lower structure 21 may be a semiconductor substrate, e.g., silicon, or a transistor structure that is electrically connected with the lower electrode 22. The lower electrode 22 may be a conductive material, e.g., a silicon electrode doped with a dopant, a metal electrode, a metal oxide electrode, etc., and may be formed on the lower structure 21. In an embodiment, the lower electrode 22 may be ruthenium (Ru) and may be deposited on a silicon oxide lower structure 21. To form the dielectric layer 23 on the lower electrode 22 using a composite oxide of a transition metal and a lanthanide group element, a precursor composite layer may be formed by mixing precursors of each material in a reaction chamber, and the precursor composite layer may be subsequently oxidized.

More specifically, where titanium (Ti) is used as the transition metal material, various Ti precursors may be used, e.g., $Ti(i-OPr)_2(TMHD)_2$, $Ti(i-OPr)_4$, $Ti(DMPD)(TMHD)_2$, etc., where i-OPr is isopropoxide, TMHD is tetramethyl-heptanedionate and DMPD is dimethypentanediol. The precursors of the lanthanide group element may include, e.g., $Ln(TMHD)_3$ or $Ln(i-PrCp)_3$, etc., where Ln is lanthanum, cerium, praseodymium, neodymium, promethium, samarium, europium, gadolinium, terbium, dysprosium, holmium, erbium, thulium, ytterbium, and/or lutetium and i-PrCp is isopropylcyclopentadiene. The amount of precursors of the transition metal and the lanthanide group element to be mixed may be controlled selectively, and the amount of the lanthanide group element is preferably in a range of approximately 30-60 atomic %. In other words, the transition metal (T) and the lanthanide group element (L) in the composite oxide may be present in an atomic ratio ranging from about 70T:30L to about 40T:60L.

A precursor composite layer may be formed on the lower electrode 22 by simultaneously inputting a precursor of the transition metal and a precursor of the lanthanide group element into a reaction chamber. Unreacted precursors may be discharged to the outside of the reaction chamber and a material containing oxygen, such as $H_2O$ or $O_3$, may be supplied to the reaction chamber to oxidize the precursor composite layer. The oxidized layer may then be heat treated, e.g., at a temperature below approximately 700° C.

Nitrification of the dielectric layer 23, e.g., by an ammonia ($NH_3$) plasma process, may be performed to help prevent crystallization of the composite oxide of the transition metal and the lanthanide group element. Where the dielectric layer is nitrided, the final dielectric layer 23 may have a structural formula of, e.g., LnTiON. An upper electrode 24 may formed on the dielectric layer 23 by coating a conductive material, e.g., Ru, on the dielectric layer.

Figure 4A:
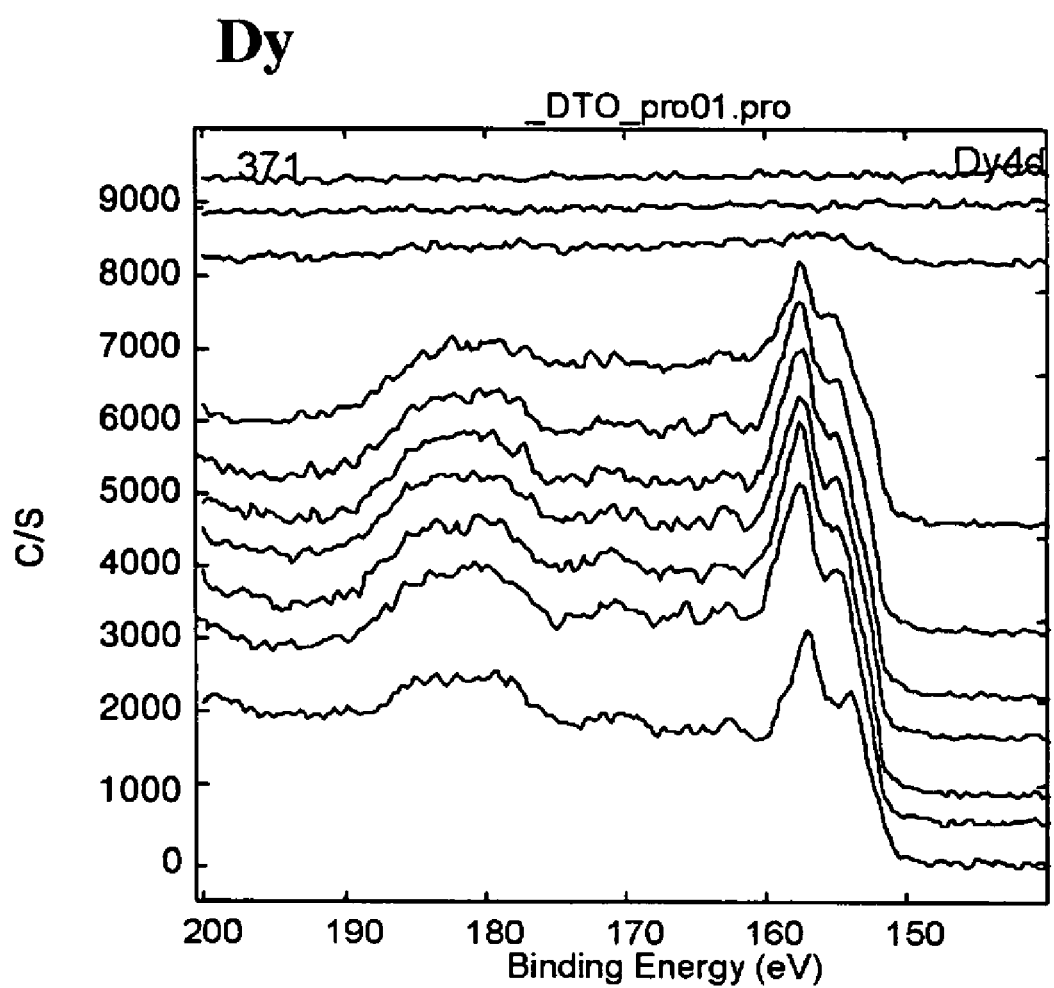
FIG. 4A illustrates a graph of oxidation concentration profiles of Dy oxides according to depths of the Dy oxides, as determined by XPS.

FIG. 4A illustrates a graph of oxidation concentration profiles of Dy oxides according to depths of the Dy oxides, as determined by XPS. As illustrated, the lanthanide group element may have a uniform oxidation state. Referring to FIG. 4A, the peaks for dysprosium Dy oxides appear at a constant binding energy, which indicates that the oxidation state of Dy is uniform.

Figure 4B:
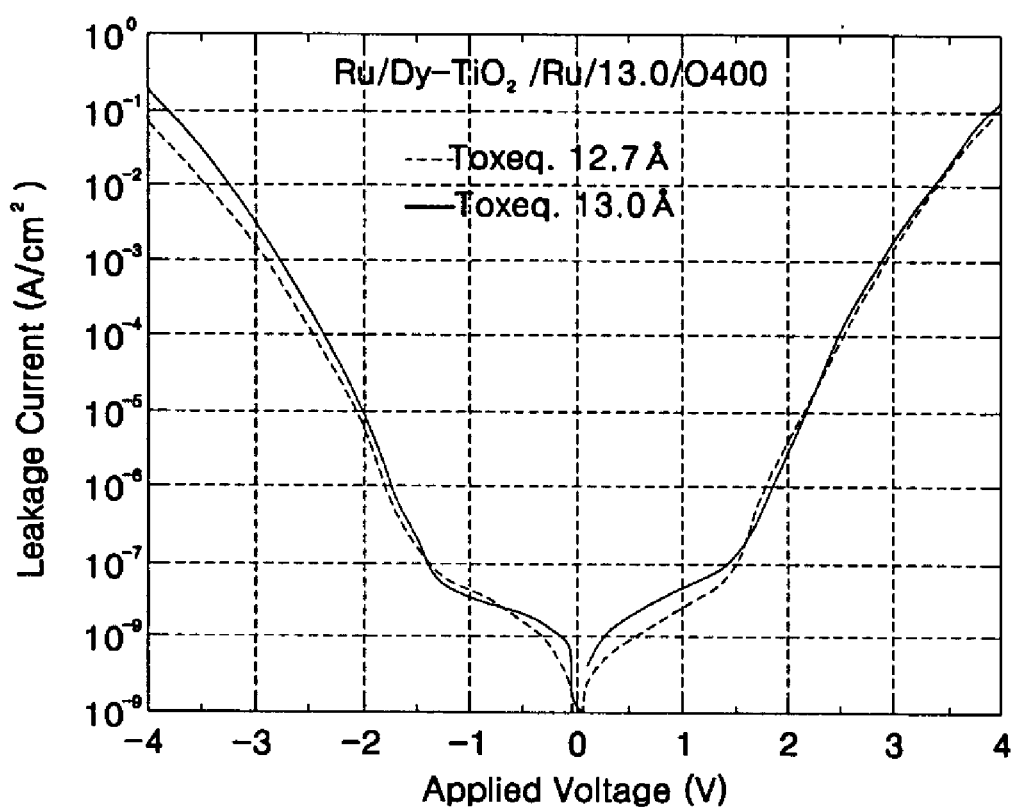
FIG. 4B illustrates a graph of leakage current density characteristics of two dielectric capacitors manufactured according to an embodiment of the present invention.

FIG. 4B illustrates a graph of leakage current density characteristics of two dielectric capacitors manufactured according to an embodiment of the present invention. In FIG. 4B, the horizontal axis represents an applied voltage through the lower and upper electrodes 22 and 24 and the vertical axis represents leakage current.

Figure 2A:
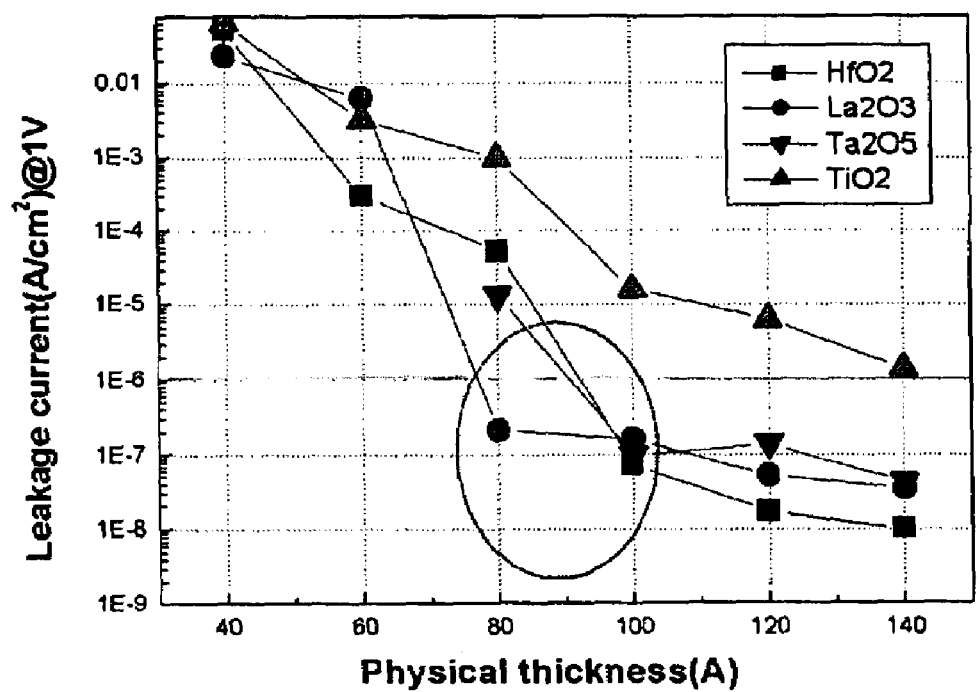
FIG. 2A illustrates a graph of leakage current density versus physical thicknesses (in Å) of dielectric layers formed of different materials, measured over a range of operating voltages.
Figure 2B:
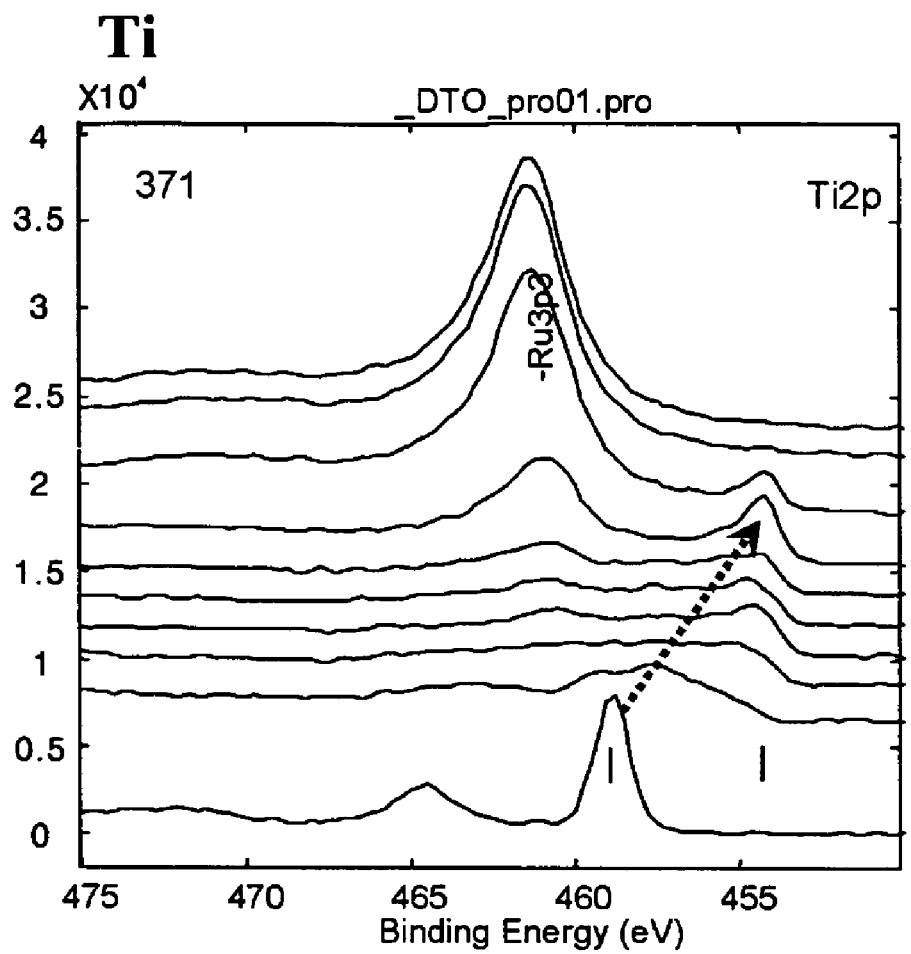
FIG. 2B illustrates a graph of $O_2$ concentration profile with respect to Ti oxides according to depths of the Ti oxides, as determined by X-ray photoelectron spectroscopy (XPS)

Referring to FIG. 4B, there is nearly no difference in leakage current density between the two dielectric capacitors. Further, the leakage current density is very low in an operational voltage range. That is, the leakage current density may be less than approximately $10^{-7} A/cm^2$. Accordingly, the leakage current value may be significantly reduced compared to a conventional dielectric layer formed of only $TiO_2$, such as that illustrated in FIG. 2A.

Figure 5:
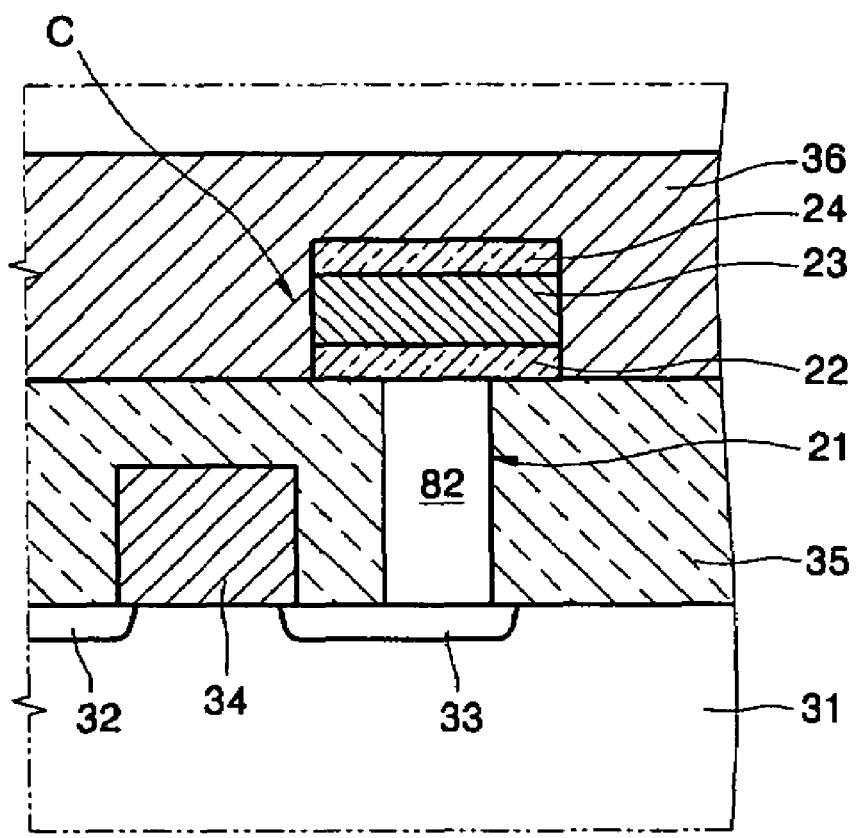
FIG. 5 illustrates a cross-sectional view of a semiconductor memory device having a capacitor structure according to an embodiment of the present invention.

FIG. 5 illustrates a cross-sectional view of a semiconductor memory device having a capacitor structure according to an embodiment of the present invention. Referring to FIG. 5, a transistor structure including first and second dopant regions 32 and 33, doped with a conductive dopant, may be formed in a semiconductor substrate 31. The transistor structure may also include a gate 34, which may be formed between the first and second dopant regions 32 and 33 and may include a gate insulating layer and a gate electrode layer. The second dopant region 33 may be connected to the lower electrode 22, e.g., through a conductive plug 82. The present invention is not limited to this structure, however, and the lower electrode may be formed on any suitable structure, which is referred to herein as a lower structure 21. The dielectric layer 23 and the upper electrode 24 may be formed on the lower electrode 22. The dielectric layer 23 may include a composite oxide of a transition metal and a lanthanide group element. The semiconductor memory device may also include insulating layers 35 and 36.

In the transistor structure, a voltage greater than a threshold voltage may be applied through the gate electrode to cause a current $I_d$ (drain current) to flow through the channel region between the first and second dopant regions 32 and 33. As a result, the transistor structure may serve as a switch for the capacitor C.

According to the present invention, a leakage current of a capacitor that uses a transition metal oxide as a dielectric layer may be significantly reduced while maintaining a high dielectric constant, comparable to a conventional transition metal oxide, by using a capacitor structure including a composite oxide of a transition metal and a lanthanide group element as the dielectric layer.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A capacitor, comprising:
a lower electrode on a semiconductor substrate;
a dielectric layer on the lower electrode; and
an upper electrode on the dielectric layer,
wherein the dielectric layer includes a composite oxide, the composite oxide consisting of an oxygen, a transition metal, and a lanthanide group element, the lanthanide group element (L) being present in the composite oxide at an atomic ratio ranging from about 70T:30L to about 40T:60L with respect to the transition metal (T).

2. The capacitor as claimed in claim 1, wherein the lanthanide group element is at least one selected from the group consisting of lanthanum, cerium, praseodymium, neodymium, promethium, samarium, europium, gadolinium, terbium, dysprosium, holmium, erbium, thulium, ytterbium, and lutetium.

3. The capacitor as claimed in claim 1, wherein the transition metal is Ti.

4. The capacitor as claimed in claim 1, wherein the lower electrode and the upper electrode both comprise ruthenium.

5. The capacitor as claimed in claim 1, wherein the dielectric layer is in an amorphous state.

6. The capacitor as claimed in claim 1, wherein the dielectric layer includes dysprosium titanate.

7. The capacitor as claimed in claim 1, wherein the dielectric layer consists of the composite oxide.

8. A capacitor, comprising:
a lower electrode on a semiconductor substrate;
a dielectric layer on the lower electrode; and
an upper electrode on the dielectric layer,
wherein the dielectric layer is a nitride of a composite oxide, the composite oxide including a transition metal and a lanthanide group element.

9. The capacitor as claimed in claim 8, wherein the dielectric layer comprises LnTiON, where Ln is at least one selected from the group consisting of lanthanum, cerium, praseodymium, neodymium, promethium, samarium, europium, gadolinium, terbium, dysprosium, holmium, erbium, thulium, ytterbium, and lutetium.

10. A semiconductor memory device, comprising;
a semiconductor substrate having first and second dopant regions; a gate structure formed between the first and second dopant regions; and a capacitor electrically connected to the second dopant region, the capacitor including:
a lower electrode;
a dielectric layer on the lower electrode; and
an upper electrode on the dielectric layer,
wherein the dielectric layer includes a composite oxide, the composite oxide consisting of an oxygen, a transition metal, and a lanthanide group element, the lanthanide group element (L) being present in the composite oxide at an atomic ratio ranging from about 70T:30L to about 40T:60L with respect to the transition metal (T).

11. The semiconductor memory device as claimed in claim 10, wherein the lanthanide group element is at least one selected from the group consisting of lanthanum, cerium, praseodymium, neodymium, promethium, samarium, europium, gadolinium, terbium, dysprosium, holmium, erbium, thulium, ytterbium, and lutetium.

12. The semiconductor memory device as claimed in claim 10, wherein the transition metal is Ti.

13. The semiconductor memory device as claimed in claim 10, wherein the dielectric layer is in an amorphous state.

14. The semiconductor memory device as claimed in claim 10, wherein the dielectric layer includes dysprosium titanate.

15. The semiconductor memory device as claimed in claim 10, wherein the dielectric layer consists of the composite oxide.

16. A semiconductor memory device, comprising:
a semiconductor substrate having first and second dopant regions; a gate structure formed between the first and second dopant regions; and a capacitor electrically connected to the second dopant region, the capacitor including:
a lower electrode;
a dielectric layer on the lower electrode; and
an upper electrode on the dielectric layer,
wherein the dielectric layer is a nitride of a composite oxide, the composite oxide including a transition metal and a lanthanide group element.

17. The semiconductor memory device as claimed in claim 16, wherein the dielectric layer comprises LnTiON, where Ln is at least one selected from the group consisting of lanthanum, cerium, praseodymium, neodymium, promethium, samarium, europium, gadolinium, terbium, dysprosium, holmium, erbium, thulium, ytterbium, and lutetium.

18. A capacitor, comprising:
a lower electrode on a semiconductor substrate;
a dielectric layer on the lower electrode; and
an upper electrode on the dielectric layer,
wherein the dielectric layer includes a composite oxide consisting of an oxygen, a titanium, and a lanthanide group.

19. The capacitor as claimed in claim 18, wherein the dielectric layer includes $Ln_2O_3$ and $TiO_2$.

20. A method of manufacturing a capacitor, comprising:
forming a lower electrode;
forming a dielectric layer on the lower electrode; and
forming an upper electrode on the dielectric layer,
wherein forming the dielectric layer includes forming a composite oxide consisting of an oxygen, a transition metal, and a lanthanide group element on the lower electrode, the lathanide group element (L) being present in the composite oxide at an atomic ratio ranging from about 70T:30L to about 40T:60L with respect to the transition metal(T).

21. The method as claimed in claim 20, wherein forming the composite oxide comprises:
    inputting a precursor of the transition metal and a precursor of the lanthanide group material into a reaction chamber;
    forming a precursor composite layer of the precursor of the transition metal and the precursor of the lanthanide group material on the lower electrode; and
    oxidizing the precursor composite layer formed of the precursor of the transition metal and the precursor of the lanthanide group material.

22. The method as claimed in claim 21 wherein oxidizing the precursor composite layer comprises;
    discharging the precursor of the transition metal and the precursor of the lanthanide group material, which remain unreacted in the reaction chamber, to the outside of the reaction chamber; and
    oxidizing the precursor composite layer of the precursor of the transition metal and the precursor of the lanthanide group material by injecting a material containing oxygen into the reaction chamber.

23. The method as claimed in claim 21, wherein the precursor of the lanthanide group element includes at least one material selected from the group consisting of $Ln(TMHD)_3$ and $Ln(i-PrCp)_3$, where Ln is at least one selected from the group consisting of lanthanum, cerium, praseodymium, neodymium, promethium, samarium, europium, gadolinium, terbium, dysprosium, holmium, erbium, thulium, ytterbium, and lutetium.

24. The method as claimed in claim 21, wherein the precursor of the transition metal includes at least one material selected from the group consisting of $Ti(i-OPr)2(TMHD)_2$, $Ti(i-OPr)_4$, and $Ti(DMPD)(TMIID)_2$.

25. The method as claimed in claim 21 further comprising nitriding the oxidized precursor composite layer.

26. The method as claimed in claim 25 wherein the nitrided oxidized precursor composite layer comprises LnTiON, where Ln is at least one selected from the group consisting of lanthanum, cerium, praseodymium, neodymium, promethium, samarium, europium, gadolinium, terbium, dysprosium, holmium, erbium, thulium, ytterbium, and lutetium.

27. The method as claimed in claim 21 wherein the precursor of the transition metal and the precursor of the lanthanide group element are provided into a reaction chamber at the same time, and wherein the precursor of the transition metal and the precursor of the lanthanide group element are oxidized together.

28. The method as claimed in claim 21, wherein the precursor of the transition metal and the precursor of the lanthanide group element are provided into a reaction chamber sequentially, and wherein the precursor of the transition metal and the precursor of the lanthanide group element are oxidized together.

29. A method of manufacturing a capacitor, comprising:
    forming a lower electrode on a semiconductor substrate;
    forming a dielectric layer on the lower electrode; and
    forming an upper electrode on the dielectric layer, wherein forming the dielectric layer includes forming a nitride of a composite oxide having a transition metal and a lanthanide group.

30. The method as claimed in claim 18, wherein forming the nitride of the composite oxide includes forming a dielectric layer having a structure of LnTiON, Ln being at least one selected from the group consisting of lanthanum, cerium, praseodymium, neodymium, promethium, samarium, europium, gadolinium, terbium, dysprosium, holmium, erbium, thulium, ytterbium, and lutetium.

* * * * *